United States Patent
Arunachalam et al.

(10) Patent No.: US 9,310,412 B2
(45) Date of Patent: Apr. 12, 2016

(54) FIELD DEVICE WITH SELF-TESTING OF A PIEZOELECTRIC TRANSDUCER

(75) Inventors: Jawahar Arunachalam, Tirunelveli (IN); Udayashankar Bangalore Kasturi, Bangalore (IN)

(73) Assignee: Rosemount Inc., Bloomington, MN (US)

( * ) Notice: Subject to any disclaimer, the term of this patent is extended or adjusted under 35 U.S.C. 154(b) by 157 days.

(21) Appl. No.: 14/112,815

(22) PCT Filed: May 28, 2012

(86) PCT No.: PCT/IB2012/052656
§ 371 (c)(1),
(2), (4) Date: Oct. 18, 2013

(87) PCT Pub. No.: WO2013/108086
PCT Pub. Date: Jul. 25, 2013

(65) Prior Publication Data
US 2014/0320154 A1    Oct. 30, 2014

(30) Foreign Application Priority Data
Jan. 20, 2012    (IN) .............................. 175/DEL/2012

(51) Int. Cl.
*G01R 31/02*    (2006.01)
*G01L 27/00*    (2006.01)
*G01D 3/08*    (2006.01)

(52) U.S. Cl.
CPC .............. *G01R 31/021* (2013.01); *G01D 3/08* (2013.01); *G01L 27/007* (2013.01)

(58) Field of Classification Search
CPC ........ G01R 31/02; G01R 27/26; G06F 15/00; H01L 41/113

USPC ........................ 324/750.3, 658, 686, 382, 519
See application file for complete search history.

(56) References Cited

U.S. PATENT DOCUMENTS

| 6,568,270 | B2 | 5/2003 | Hongerholt |
| 6,834,258 | B2 | 12/2004 | Schulte et al. |
| 7,042,228 | B2 | 5/2006 | Lally et al. |
| 7,258,024 | B2 | 8/2007 | Dimarco et al. |
| 7,720,625 | B2 | 5/2010 | Keese et al. |

(Continued)

FOREIGN PATENT DOCUMENTS

| CN | 101669019 A | 3/2010 |
| JP | 06-092784 B | 2/1985 |

(Continued)

OTHER PUBLICATIONS

Patent Cooperation Treaty, International Search Report and Written Opinion, Oct. 31, 2012, 8 pages.

(Continued)

*Primary Examiner* — Tung X Nguyen
*Assistant Examiner* — Zannatul Ferdous
(74) *Attorney, Agent, or Firm* — Kinney & Lange, P.A.

(57) ABSTRACT

An industrial process field device having a piezoelectric transducer performs self-testing of the condition of the piezoelectric transducer during a self-test mode. A charging current is supplied to the piezoelectric transducer, and voltage on the piezoelectric transducer as a result of the charging current is monitored. A diagnostic test result indicating condition of the piezoelectric transducer is produced based on the magnitude of the voltage.

13 Claims, 3 Drawing Sheets

(56) References Cited

U.S. PATENT DOCUMENTS

| | | |
|---|---|---|
| 2004/0128110 A1* | 7/2004 | Schulte et al. ............... 702/188 |
| 2006/0152109 A1* | 7/2006 | Micko ............................ 310/319 |
| 2009/0064762 A1 | 3/2009 | Horner et al. |
| 2010/0043531 A1* | 2/2010 | Garrard et al. ............... 73/35.07 |
| 2010/0122565 A1 | 5/2010 | Miller et al. |
| 2010/0167430 A1 | 7/2010 | Steele et al. |
| 2011/0101992 A1 | 5/2011 | Zu et al. |
| 2011/0140685 A1 | 6/2011 | Zu et al. |

FOREIGN PATENT DOCUMENTS

| | | |
|---|---|---|
| JP | 2002345264 A | 11/2002 |
| WO | 2008122842 A1 | 10/2008 |

OTHER PUBLICATIONS

The Chinese First Office Action mailed Jun. 18, 2015 for Chinese Application No. 201280067520.3.

Japanese Office Action dated Jan. 20, 2016, for corresponding Japanese Application No. 2014-552700.

* cited by examiner

FIELD DEVICE WITH SELF-TESTING OF A PIEZOELECTRIC TRANSDUCER

BACKGROUND

The present invention relates to industrial process monitoring and control systems. More specifically, the present invention relates to a field device, such as a process transmitter or process controller, having a normal operating mode and a diagnostic self-test mode in which condition of a piezoelectric transducer is tested.

A process transmitter includes a sensing element or transducer that responds to a process variable, and signal conditioning and processing circuitry to convert the sensed variable into a transmitter output that is a function of the sensed process variable. The term "process variable" refers to a physical or chemical state of matter or conversion of energy. Examples of process variables include pressure, temperature, flow, conductivity, PH, and other properties. Process transmitters are typically used to monitor process variables and send measurement values back to a control room in a chemical, petroleum, gas, pharmaceutical, or other fluid processing plant. Often these environments are subject to harsh and varying environmental conditions.

A process controller includes an actuator or transducer and actuator drive circuitry that convert an electrical command to a physical output. The process controller, for example, may open or close a valve, or change a process parameter such as pressure in response to a command received from a control room in a fluid processing plant.

All electrical components, including the transducers and circuitry of field devices, have the potential to malfunction or fail. Such a malfunction could result in a faulty measurement being sent by the process transmitter to the control room, or the failure of a process controller perform a commanded action. Routine testing by a skilled technician can detect problems with a field device, but that requires the technician to physically access the field device. In facilities having a substantial number of distributed field devices, there is a practical limit to how frequently a technician can visit and test each field device.

Piezoelectric transducers are used as sensors in some process transmitters. The piezoelectric sensors may be either passive sensors which produce an electrical sensor output as a function of applied force, or active sensors that transmit and receive signals. Piezoelectric transducers also are used as actuators or drive elements in some process controllers.

One example of a process transmitter that uses a piezoelectric transducer detects gas/steam leakages in a hazardous environment. The transmitter detects whether safety valves are open or closed, and blow through or plugged conditions within steam traps. The transmitter includes a piezoelectric sensor, signal conditioning circuits, and a microcontroller. Measurement values may be sent by the transmitter to a control room over a wired loop, a wired transmission bus, or by wireless transmission such as through a wireless mesh network. The piezoelectric sensor is excited by vibrations in the ultrasonic frequency range, for example, that are produced when a steam trap fails.

Because a process transmitter used to detect gas/steam leakages is typically deployed in hazardous/safety critical applications, the process transmitter would desirably have self-testing or self-diagnosing capability. The electronics can be verified using a diagnosing routine that is executed often. On the other hand, self-testing by the processor of the function of the piezoelectric transducer has not been available.

One way to check whether the piezoelectric transducer of a process transmitter used to detect gas/steam leakages is to deliberately produce a leak to verify piezoelectric sensor functionality. This technique, however, has significant disadvantages. First, in the case of safety valves, a penalty is levied for the gas that is released into the atmosphere during the diagnostic procedure. Second, producing a deliberate leak to verify transducer functionality does not work in the case of steam traps.

SUMMARY

A field device having a normal operation mode and a self-test mode includes a piezoelectric transducer, transducer circuitry, and self-test circuitry. The piezoelectric transducer senses a process variable. During normal operation, the sensor circuitry derives a sensor signal representative of the process variable from the piezoelectric sensor. During self-test mode, the self-test circuitry supplies a charging current to the piezoelectric sensor and provides a test output as a function of voltage on the piezoelectric sensor as a result of the charging current.

DETAILED DESCRIPTION

Figure 1A:
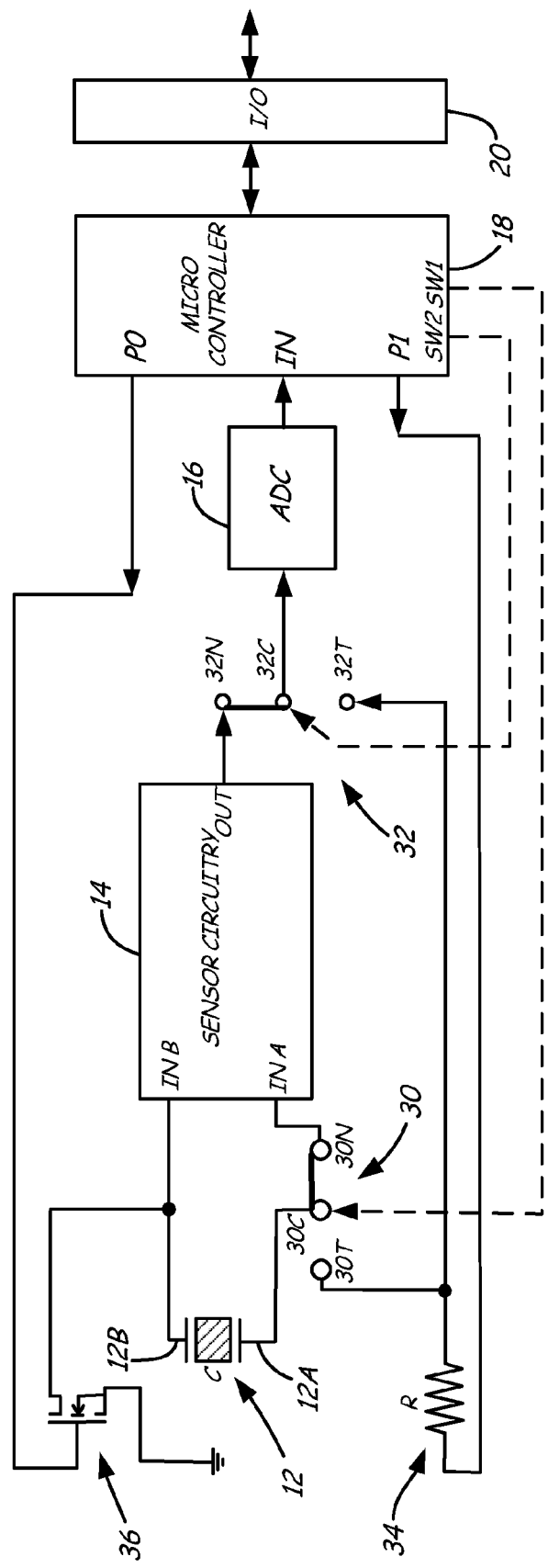
FIGS. 1A and 1B are schematic diagrams of a process transmitter during normal operation mode, and during a self-test mode for testing condition of a piezoelectric sensor, respectively.
Figure 1B:
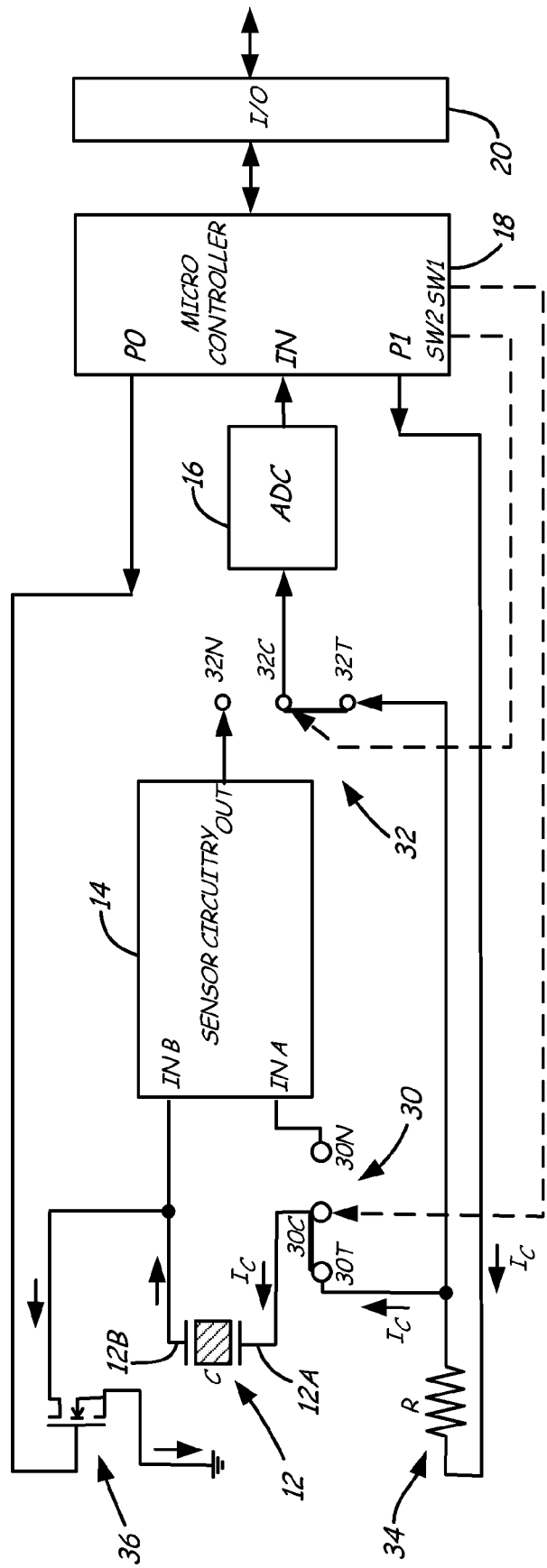

FIGS. 1A and 1B show a field device, process transmitter 10, in normal operation mode and in self-test mode, respectively. Process transmitter 10 includes piezoelectric sensor 12, sensor circuitry 14, analog-to-digital converter (ADC) 16, microcontroller 18, input/output (I/O) interface 20, and self-test circuitry including switches 30 and 32, resistor 34, and field effect transistor (FET) 36. Switches 30 and 32 are analog switches under the control of microcontroller 18. Switch 30 includes common terminal 30C normal mode terminal 30N, and test mode terminal 30T. Similarly, switch 32 includes common terminal 32C, normal mode terminal 32N, and test mode terminal 32T.

As shown in FIG. 1A, process transmitter 10 includes a normal operation mode in which piezoelectric sensor 12 is used to sense a process variable (e.g. gas or steam leakage). During normal operation mode, common terminals 30C, 32C of switches 30, 32 are connected to normal mode terminals 30N and 32N, respectively. Thus, sensor circuitry 14 has inputs INA and INB connected to opposite terminals 12A and 12B, respectively, of piezoelectric sensor 12 during the normal operation mode. Output OUT of sensor circuitry 14 is connected through terminals 32N and 32C of switch 32 to the input of ADC 16 in the normal mode. The output of ADC 16 is provided to input port IN of microcontroller 18.

Port P0 of microcontroller 18 is connected to the gate of FET 36. In the embodiment shown in FIGS. 1A and 1B, FET 36 is an N-channel MOSFET which is turned off when port P0 is logic low and is turned on when port P0 is logic high. During normal operation mode, port P0 is logic low and FET 36 is turned off.

Port P1 of microcontroller 18 is connected to resistor 34, which is then connected to the test terminals 30T and 32T of switches 30 and 32, respectively. During normal operation mode, port P1 is logic low, and terminals 30T and 32T of switches 30 and 32 are not connected to common terminal 30C and 32C. As a result, no current flows through resistor 34 during normal operation mode, and resistor 34 is not connected to piezoelectric sensor 12.

During normal operation mode, piezoelectric sensor 12 produces a signal at inputs INA and INB as a function of the sensed process variable. For example, piezoelectric sensor 12 may be strapped onto a steam pipe and respond to frequency and magnitude of vibration produced when a steam trap fails. Sensor circuitry 34 conditions the signal from sensor 12 and provides the sensor signal as an analog input to ADC 16. The analog sensor signal from sensor circuitry 14 is converted to digital form by ADC 16, and is provided to microcontroller 18.

Microcontroller 18, which typically includes a microprocessor with associated memory, further processes the digitized sensor signal and produces a measurement value. Microcontroller 18 communicates through input/output interface 20 with the control room or other monitoring system. Microcontroller 18 provides measurement values of the process variable, as well as other data including, for example, secondary variable data and diagnostic data, to the control room. I/O interface 20 may communicate with the control room in an analog format or in both analog and digital formats over a two wire loop, in a digital format over a multi-drop digital bus, or wirelessly over a wireless network.

As shown in FIG. 1B, process transmitter 10 also includes a diagnostic self-test mode in which the condition of piezoelectric sensor 12 is tested by supplying a charging current Ic to piezoelectric sensor 12 and performing a transient response analysis. Capacitance C of piezoelectric sensor 12 and resistance R of resistor 34 form an RC circuit during the self-test mode. Voltage across piezoelectric sensor 12 is sampled through ADC 16 during a charging time period.

Microcontroller 18 determines when the diagnostic self-test mode will be performed. The testing may be based upon instructions provided from the control room to microcontroller 18 through I/O interface 20, or may be programmed into microcontroller 18 so that self-test operation occurs on a periodic schedule.

To initiate self-test operation, microcontroller 18 provides switch control signals SW1 and SW2 to switches 30 and 32, respectively. Signals SW1 and SW2 cause switches 30 and 32 to change state, so that common terminals 30C and 32C are connected to test terminals 30T and 32T. As a result, terminal 12A of piezoelectric sensor 12 is connected to resistor 34 through switch 30 and to the input of ADC 16 through switch 32.

During self-test mode, microcontroller 18 causes ports P0 and P1 to be output logic high. As a result, FET 36 turns on, connecting terminal 12B of sensor 12 to ground. The output logic high at port P1 causes charging current Ic to flow from port P1 through resistor 34, terminals 30T and terminal 30C to terminal 12A of sensor 12.

Figure 2:
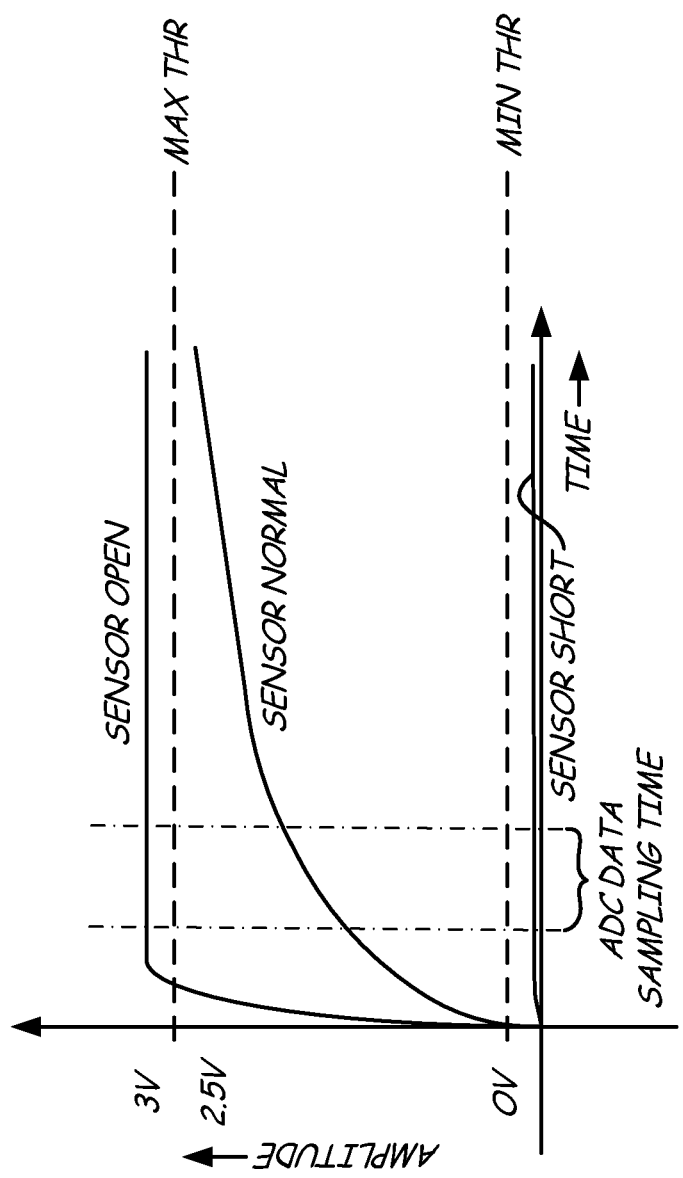
FIG. 2 is a graph showing voltage across a piezoelectric sensor as a function of time during a self-test mode in which charging current is supplied to the piezoelectric sensor.

As charging current Ic is supplied to piezoelectric sensor 12, voltage across sensor 12 is sampled by ADC 16. Within a particular time period after ports P0 and P1 go high, sensor 12 will have charged to a value that can be read by ADC 16 and supplied to microcontroller 18. Depending on the sample data (i.e. ADC count from ADC 16), microcontroller 18 can determine the status of piezoelectric sensor 12. Three possible conditions can be detected, as illustrated by the graph in FIG. 2. FIG. 2 illustrates voltage at terminal 12A of piezoelectric sensor 12 (and at the input to ADC 16) as a function of time for three different conditions: a normally functioning piezoelectric sensor ("Sensor Normal"), a failed sensor that is acting as an electrical short circuit ("Sensor Short"), and a failed sensor acting as an electrical open circuit ("Sensor Open").

As shown in FIG. 2, a failed sensor acting as a short will show a voltage near zero during the data sampling time of ADC 16. A sensor that has failed in an open circuit condition has a charging curve that rises very rapidly to the maximum voltage determined by port P1. In contrast, a piezoelectric sensor exhibiting a normal capacitance will have a RC charging curve of the general shape shown in FIG. 2. The voltage sampled by ADC 16 will be in a range between a first or minimum threshold level and a second or maximum threshold level shown in FIG. 2. In contrast, a sensor exhibiting a short circuit condition will exhibit a voltage that is below the minimum threshold, and a sensor that has failed in an open circuit condition will exhibit a voltage that is above the maximum threshold.

Microcontroller 18 receives the ADC count from ADC 16 and compares that count to the minimum and maximum threshold values. If the count is below the minimum threshold or above the maximum threshold, microcontroller 18 produces a diagnostic output indicating that a sensor failure condition exists. If the ADC count is between the minimum and maximum thresholds, microcontroller 18 provides a diagnostic output indicating that piezoelectric sensor 16 is in a no failure or normal condition. The diagnostic output may simply indicate that the sensor has failed, or may identify the nature of the failure (either a short circuit or an open circuit failure condition).

The diagnostic self-test mode of process transmitter 10 provides a way to verify the functionality of a piezoelectric sensor or transducer. In the context of a transmitter that detects gas/steam leakage in hazardous environments, the diagnostic self-test mode avoids the need to produce a deliberate leak in order to verify sensor functionality.

Although the diagnostic self-test has been described in the context of a process transmitter with a piezoelectric sensor, and in particular a sensor that can be used to detect gas/steam leakages, the self-test using charging current to a piezoelectric transducer can be used to detect failure of piezoelectric transducers in a number of different applications. The piezoelectric transducers may be used to sense a parameter, or may be an actuator used to convert electrical energy into a physical action.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

We claim:
1. A field device comprising:
a piezoelectric transducer having a first terminal and a second terminal;
normal mode circuitry for operating the piezoelectric transducer during a normal operation mode; and
self-test circuitry for supplying a charging current to the piezoelectric transducer during a diagnostic self-test mode and providing a test signal as a function of voltage on the piezoelectric transducer as a result of the charging current, wherein the self-test circuitry includes:

a resistor for supplying the charging current through the resistor to the first terminal of the piezoelectric transducer; and switching circuitry for disconnecting the normal mode circuitry, for connecting the resistor to the first terminal of the piezoelectric transducer, and for connecting the second terminal to ground during the diagnostic self-test mode, wherein, during the diagnostic self-test mode, the self-test circuitry samples the voltage on piezoelectric transducer within a predetermined time period after the charging current is supplied to the piezoelectric transducer, wherein, if the voltage on the piezoelectric transducer exhibits a RC charging curve representative of a normal capacitance indicated by the sampled voltage being between a first threshold value and a second threshold value, then the self-test circuitry provides a test signal that indicates a normal condition.

2. The field device of claim 1, wherein the self-test circuitry includes:
an analog-to-digital converter that is connected by the switching circuitry during the diagnostic self-test mode to produce a digital output as a function of voltage on the piezoelectric transducer.

3. The field device of claim 2, wherein the self-test circuitry includes:
a microcontroller that provides switch control signals to the switching circuitry and provides the test signal based upon the digital output of the analog-to-digital converter.

4. The field device of claim 3, wherein the charging current supplies a voltage to the resistor during the diagnostic self-test mode.

5. The field device of claim 3, wherein the piezoelectric transducer comprises a piezoelectric sensor, and the normal mode circuitry derives a sensor signal from the piezoelectric sensor.

6. The field device of claim 5, wherein the switching circuitry connects the normal mode circuitry to the analog-to-digital converter during the normal operation mode.

7. The field device of claim 6, wherein the analog-to-digital converter produces a digital output during the normal operation mode that is a function of the sensor signal.

8. The field device of claim 1, wherein the self-test circuitry provides a test signal that indicates a failed condition if the voltage on the piezoelectric transducer is less than the first threshold value.

9. The field device of claim 1, wherein the self-test circuitry provides a test signal that indicates a failed condition if the voltage or the piezoelectric transducer is greater than the second threshold value.

10. A method for testing condition of a piezoelectric transducer in a field device, the method comprising:
disconnecting normal mode circuitry from the piezoelectric transducer during a test period;
supplying a charging current through a resistor to a first terminal of the piezoelectric transducer during the test period;
connecting a second terminal of the piezoelectric transducer to ground during the test period;
monitoring a voltage on the piezoelectric transducer as a result of the charging current during the test period; and
producing a diagnostic test result indicative of condition of the piezoelectric transducer based upon magnitude of the voltage,
wherein the produced diagnostic test result indicates a normal condition, if the monitored voltage on the piezoelectric transducer exhibits a RC charging curve representative of a normal capacitance indicated by the monitored voltage being between a first threshold value and a second threshold value.

11. The method of claim 10, wherein the diagnostic test result indicates a failed condition of the piezoelectric transducer if the voltage is less than the first threshold value.

12. The method of claim 10, wherein the diagnostic test result indicates a failed condition of the piezoelectric transducer if the voltage is greater than the second threshold value.

13. The method of claim 10, wherein the piezoelectric transducer is a sensor for sensing a process variable during a normal operation mode.

* * * * *